United States Patent
Lin et al.

(10) Patent No.: US 10,269,573 B2
(45) Date of Patent: Apr. 23, 2019

(54) DEVICE AND METHOD FOR MANUFACTURING A SEMICONDUCTOR STRUCTURE

(71) Applicant: TAIWAN SEMICONDUCTOR MANUFACTURING COMPANY LTD., Hsinchu (TW)

(72) Inventors: Kun-Mo Lin, New Taipei (TW); Keith Kuang-Kuo Koai, Hsinchu County (TW); Chih-Tsung Lee, Hsinchu (TW); Victor Y. Lu, Foster City, CA (US); Yi-Hung Lin, Taipei (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 298 days.

(21) Appl. No.: 14/230,112

(22) Filed: Mar. 31, 2014

(65) Prior Publication Data

US 2015/0279632 A1  Oct. 1, 2015

(51) Int. Cl.
*H01L 21/30* (2006.01)
*H01L 21/687* (2006.01)
*H01J 37/32* (2006.01)

(52) U.S. Cl.
CPC ........ *H01L 21/30* (2013.01); *H01J 37/32541* (2013.01); *H01J 37/32715* (2013.01)

(58) Field of Classification Search
CPC .............................. H01L 21/30; H01L 23/498
See application file for complete search history.

(56) References Cited

U.S. PATENT DOCUMENTS

| | | | | |
|---|---|---|---|---|
| 2001/0054381 A1* | 12/2001 | Umotoy | ............... | C23C 16/4401 118/715 |
| 2002/0038992 A1* | 4/2002 | Morita | .................... | H01T 13/39 313/141 |
| 2008/0041312 A1* | 2/2008 | Matsuyama | ......... | C23C 16/4586 118/728 |
| 2008/0179010 A1* | 7/2008 | Bailey, III | ......... | H01L 21/02087 156/345.43 |
| 2008/0210084 A1* | 9/2008 | Ota | .................... | B01D 53/0407 95/11 |
| 2009/0223810 A1* | 9/2009 | Dhindsa | ............ | H01J 37/32091 204/164 |
| 2010/0025372 A1* | 2/2010 | Tsujimoto | .......... | H01J 37/32091 216/71 |
| 2011/0148276 A1* | 6/2011 | Sakayanagi | ............. | H01T 13/39 313/141 |
| 2013/0133834 A1* | 5/2013 | Dhindsa | ............ | H01L 21/67069 156/345.51 |

\* cited by examiner

*Primary Examiner* — Moazzam Hossain
(74) *Attorney, Agent, or Firm* — WPAT, P.C., Intellectual Property Attorneys; Anthony King

(57) ABSTRACT

A device includes a pedestal. The pedestal includes a ground electrode, a central portion, and a peripheral portion. The ground electrode includes a top surface from which the peripheral portion is projected, thereby having a height difference between the central portion and the peripheral portion.

20 Claims, 16 Drawing Sheets

DEVICE AND METHOD FOR MANUFACTURING A SEMICONDUCTOR STRUCTURE

BACKGROUND

Presently, many modern applications require electronic equipment. Therefore, consumers are increasingly demanding more processing power, lower electrical power usage and cheaper devices. As the electronic industry strives to meet these demands and more complicated and denser configurations, miniaturization will result in an extension of the number of chips per wafer and the number of transistors per chip, as well as a reduction in power usage. Plasma-related technology has been gaining popularity since the electronic components are being designed to be lighter, smaller, more multifunctional, more powerful, more reliable and less expensive. The plasma-related technology allows to overcome the traditional limitations of miniaturization, and is widely applied in order to meet continuous demands toward the miniaturization and higher functions of the electronic components.

During the plasma forming process, plasma is formed above a masked surface of a wafer substrate by adding large amounts of energy to a gas. Non-uniform plasma density across the surface of the substrate usually occurs. Typically, the plasma density in a region near the edge of the wafer substrate is less than that at the center. Since the plasma density above the substrate is poorly controlled, improvements for a plasma-related technology continue to be sought.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

A more complete understanding of the present disclosure may be derived by referring to the detailed description and claims when considered in connection with the Figures, where like reference numbers refer to similar elements throughout the Figures, and:

DETAILED DESCRIPTION

Figure 1:
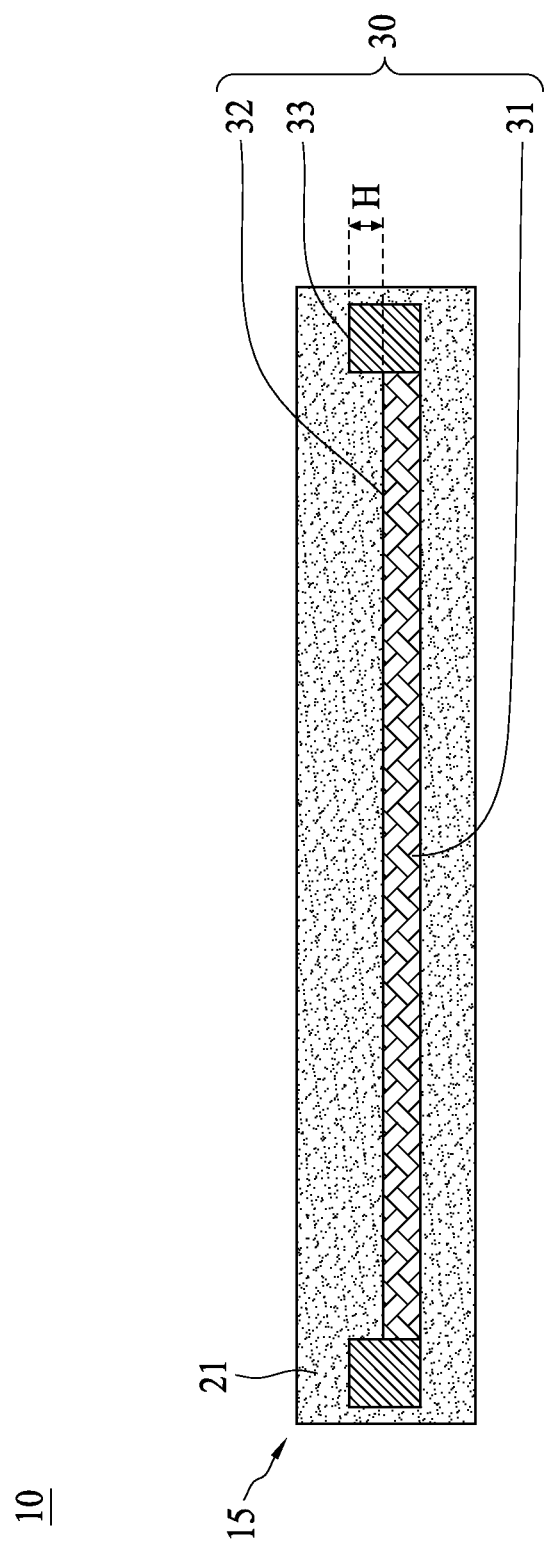
FIG. 1 is a cross-sectional view of a device including a pedestal, wherein the pedestal includes a ground electrode having a top surface, a central portion, and a peripheral portion in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Plasma processing is typically conducted in a parallel plate reactor apparatus, wherein the reactor volume is defined by a pair of closely spaced electrodes. In the present disclosure, at least one of the electrode has a uneven surface, thereby adjusting a gap or space between those electrodes so as to form a more uniform plasma density across the surface of a substrate. In the present disclosure, the uniformity during plasma processing of substrates such as silicon wafers, flat panel display substrates, and the like is improved by modifying the material of a heater layer.

In various embodiments, a ground electrode of the pair-spaced electrodes includes a peripheral portion, which is projected from a top surface of the ground electrode and hence the peripheral portion is thicker than the other portion of the ground electrode. By such design, a distance between the peripheral portion and the opposing electrode is reduced. For some embodiments, a substrate is located above the ground electrode and an edge of the substrate is disposed proximal to the peripheral portion of the ground electrode. Thus, the reduced gap resulting from the peripheral portion enhances a plasma density near an edge of a substrate so as to produce more uniform plasma across the entire surface of the substrate. In various embodiments, the heater layer is disposed under the substrate and includes an inner portion and an outer portion, which is close to the edge of the substrate. The material of the outer portion has a permittivity greater than that of the inner portion so as to generate uniform plasma above a surface of the substrate from the edge to the center.

In describing and claiming the present disclosure, the following terminology will be used in accordance with the definitions set forth below.

As used herein, a "substrate" refers to a bulk substrate on which various layers and device structure are formed. In some embodiments, the bulk substrate includes silicon or a compound semiconductor, such as GaAs, InP, Si/Ge, or SiC. Examples of the layers include dielectric layers, doped layers, polysilicon layers, or conductive layers. Examples of the device structures include transistors, resistors, and/or capacitors, which are interconnected through an interconnect layer to additional integrated circuits. In some embodiments, the bulk substrate includes a semiconductor substrate such as a polished wafer, an epi wafer, an argon anneal wafer, a hai wafer and a silicon on insulator (SOI) wafer.

As used herein, a "semiconductor substrate" refers to a chip carrier, which is generally manufactured using two complex manufacturing processes, i.e., front-end manufacturing, and back-end manufacturing, each involving potentially hundreds of operations. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation. Active electrical components, such as transistors, have the ability to control the flow of electrical current. Passive electrical components, such as capacitors, inductors, resistors, and transformers, create a relationship between voltage and current that is necessary to perform electrical circuit functions.

As used herein, "active and passive components" refers to components, which are formed on the surface of the semiconductor wafer by a series of process operations including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into a permanent insulator, permanent conductor, or changing the way the semiconductor material changes in conductivity in response to an electric field. Transistors contain regions of varying types and degrees of doping arranged as necessary to enable the transistor to promote or restrict the flow of electrical current upon the application of an electric field.

Active and passive components are formed by layers of materials with different electrical properties. The layers are formed by a variety of deposition techniques determined in part by the type of material being deposited. For example, thin film deposition involves chemical vapor deposition (CVD), physical vapor deposition (PVD), electrolytic plating, and electroless plating processes. Each layer is generally patterned to form portions of active components, passive components, or electrical connections between components. The layers are patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

As used herein, "back-end manufacturing" refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting device or saw blade. After singulation, the individual dies are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

In some embodiments, as in FIG. 1, a cross-sectional view of a device 10 is shown. The device 10 includes a pedestal 15, which includes a ground electrode 30. The ground electrode 30 includes a top surface 32, a central portion 31, and a peripheral portion 33.

In some embodiments, the central portion 31 is a substantially planar structure. When referring herein to a planar structure, the reference includes the concept of a flat plate, which actually has a top flat surface, a bottom flat surface, and a thickness, with the top and bottom flat surfaces technically lying along parallel planes. In certain embodiments, the thickness of the central portion 31 is from about 1.25 mm to about 3.15 mm. In other embodiments, the thickness of the central portion 31 is from about 0.95 mm to about 2.75 mm. In some embodiments, the thickness of the central portion 31 is from about 1.65 mm to about 2.35 mm. In some other embodiments, the thickness of the central portion 31 is from about 2.25 mm to about 3.0 mm.

In some embodiments, the peripheral portion 33 is disposed on the peripheral area of the ground electrode 30 and a height difference H exists between the central portion 31 and the peripheral portion 33. In other words, the peripheral portion 33 is thicker than the central portion 31 along a direction substantially perpendicular to the top surface 32. In certain embodiments, the thickness of the peripheral portion 33 is from about 3.25 mm to about 5.75 mm. In other embodiments, the thickness of the peripheral portion 33 is from about 3.95 mm to about 4.95 mm. In some embodiments, the thickness of the peripheral portion 33 is from about 4.25 mm to about 7.35 mm. In some other embodiments, the thickness of the peripheral portion 33 is from about 5.25 mm to about 9.65 mm. Thus, the height difference H ranges from about 0.1 mm to about 8.7 mm.

In some embodiments, the ground electrode 30 is formed of any suitable material such as graphite, silicon, silicon carbide and aluminum. The peripheral portion 33 is a part integrated with the monolithic ground electrode 30 (e.g., machined or otherwise formed in a single piece of material) or is made as a separate piece and bonded (e.g., metallurgically or adhesively) or otherwise secured to the top surface 32 of the ground electrode 30. The peripheral portion 33 is made from the same material as the ground electrode 30 or from a different material. As with the ground electrode 30, the peripheral portion 33 is also made from materials such as graphite, silicon, silicon carbide or aluminum. In some embodiments, the peripheral portion 33 may be made from dielectric materials such as quartz.

In some embodiments, the pedestal 15 further includes an insulator layer 21 disposed on the ground electrode 30. The pedestal 15 includes an electrostatic chuck (ESC) and an edge ring (not shown), which surrounds the electrostatic chuck. The edge ring is a replaceable component which tends to become hot during processing of a substrate and thus is referred to as a hot edge ring (HER). In certain embodiments, the edge ring is made from relatively conductive electrode materials such as SiC and silicon or from dielectric materials such as quartz. By changing the edge ring material, the degree of coupling through the plasma is tailored to provide a desired localized plasma density at an edge of the substrate being processed. SiC (Silicon carbide), having a lower capacitive impedance, generally produces a higher plasma density than silicon. Quartz and other dielectrics have a lesser effect on the edge plasma density.

Figure 2:
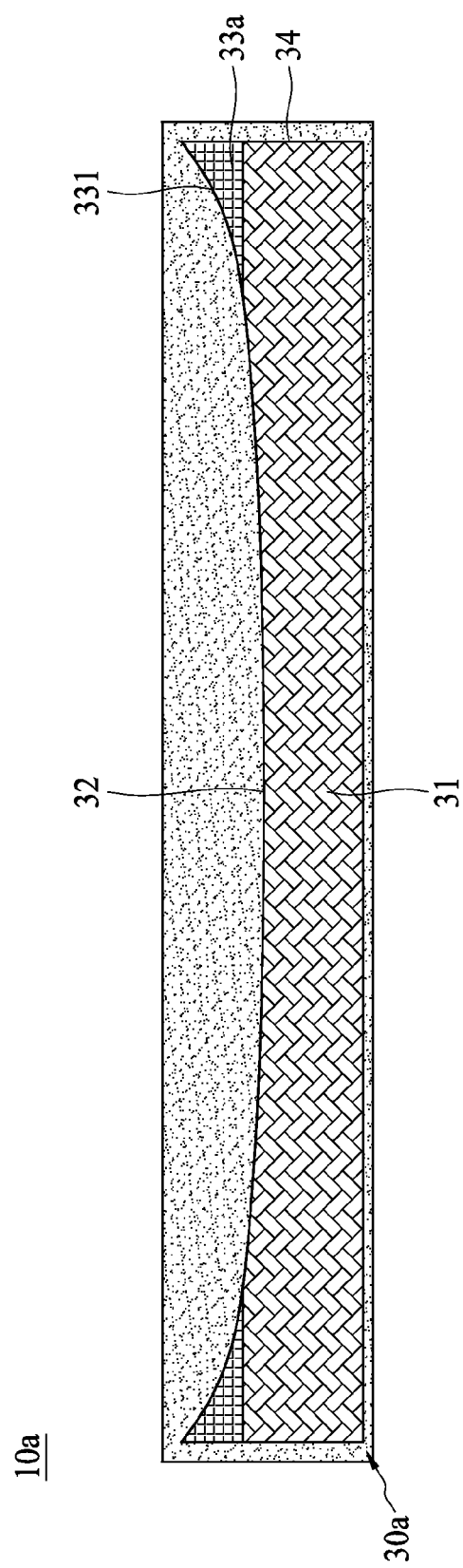
FIG. 2 is a cross-sectional view of a pedestal including a ground electrode and a concave top surface of the ground electrode in accordance with certain embodiments of the present disclosure.

In certain embodiments, as shown in FIG. 2, a peripheral portion 33a of a device 10a is projected from the top surface 32 and includes an arc surface 331. Particularly, the arc surface 331 of the peripheral portion 33a includes a highest thickness at an edge 34 of the ground electrode 30a. In this case, the arc surface 331 extends and merges with the top surface 32 at one end to form a concave surface. In other words, the top surface 32 atop the central portion 31 is tailored to be concave in accordance with the arc surface 331.

Figure 3:
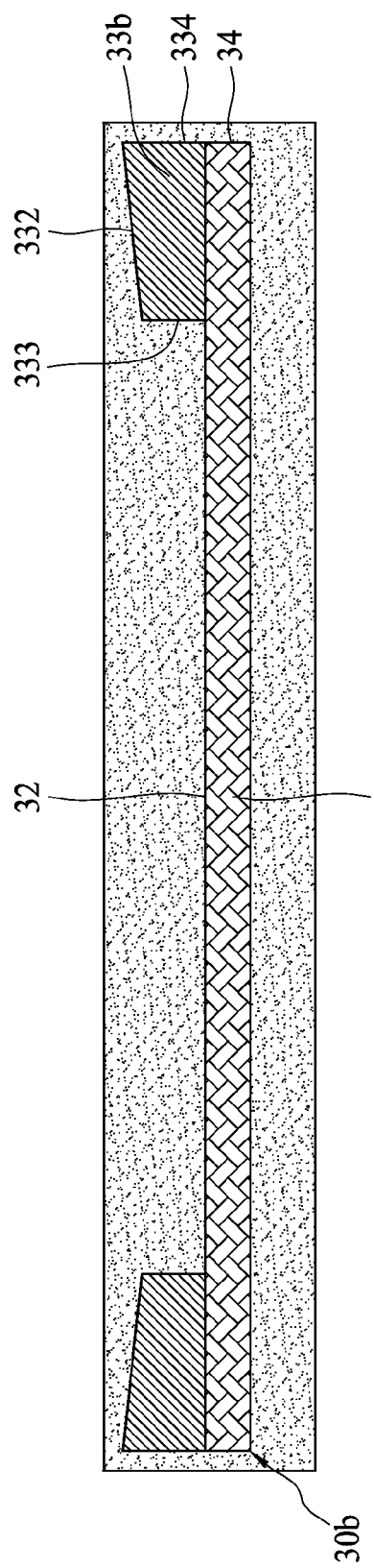
FIG. 3 is a cross-sectional view of a pedestal including a ground electrode and a peripheral portion of the ground electrode having an inclined surface slanting toward the central portion of the ground electrode in accordance with other embodiments of the present disclosure.

In certain embodiments, as in FIG. 3, a ground electrode 30b includes a peripheral portion 33b, which includes an inclined surface 332, an inner surface 333, and an outer surface 334. The inclined surface 332 slants toward the central portion 31 and hence includes a highest thickness at the edge 34 of the ground electrode 30b. The inner surface 333 is parallel to the outer surface 334, which is perpendicular to the ground electrode 30b. In other embodiments, the inclined surface 332 has an adjustable slope, which is predetermined in accordance with the desired localized plasma density at an edge of the substrate.

Figure 4:
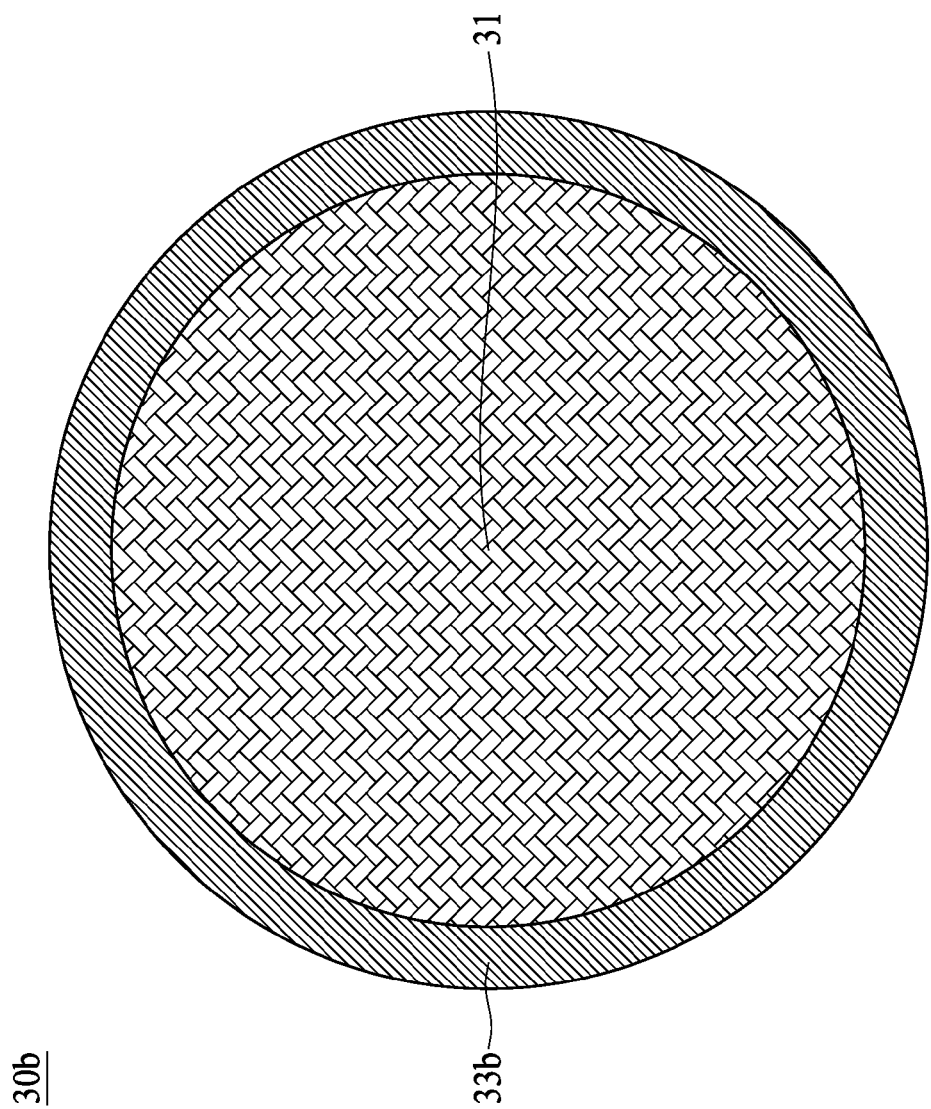
FIG. 4 is a top view of a ground electrode including a central portion and a peripheral portion surrounding the central portion in accordance with some embodiments of the present disclosure.
Figure 5:
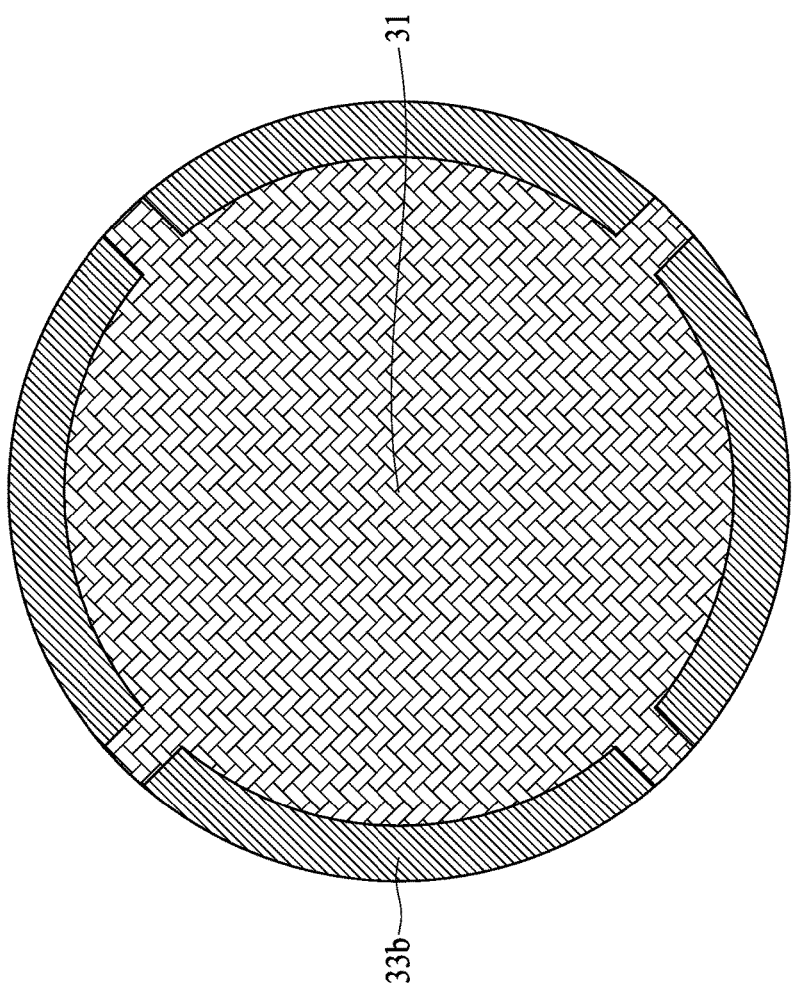
FIG. 5 is a top view of a ground electrode including a central portion and a peripheral portion surrounding the central portion, wherein the peripheral portion is divided into several parts in accordance with some embodiments of the present disclosure.

FIG. 4 is a top view of the ground electrode 30b of FIG. 3. The peripheral portion 33b is located around the central portion 31 and the peripheral portion 33b is a circular structure. In certain embodiments, as in FIG. 5, the peripheral portion 33b is divided into several sections and partially surrounds the central portion 31. In other words, the peripheral portion 33b is located partially around the central portion 31 instead of continuously surrounding the central portion 31. The distribution of the divided sections is adjustable, thus the peripheral portion 33b is capable of dynamically adjusting the localized plasma density at an edge of the substrate.

Figure 6:
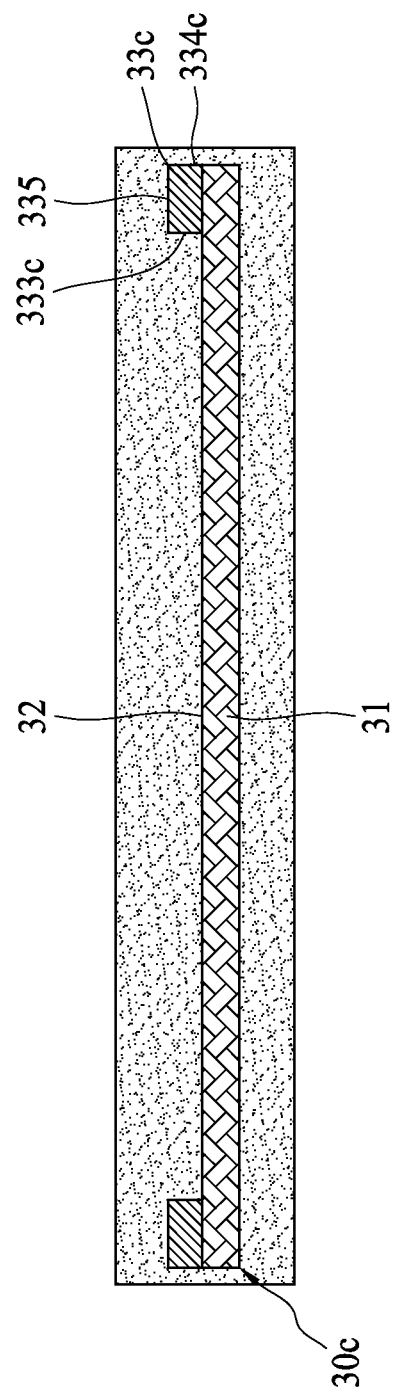
FIG. 6 is a cross-sectional view of a pedestal including a ground electrode, wherein a peripheral portion of the ground electrode has an upper surface parallel to the top surface of the ground electrode in accordance with some embodiments of the present disclosure.

In other embodiments, as in FIG. 6, a ground electrode 30c includes a peripheral portion 33c, which includes an upper surface 335, an inner surface 333c, and an outer surface 334c. The upper surface 335 of the peripheral portion 33c is substantially parallel to the top surface 32 of the ground electrode 30c. The inner surface 333c is proximal to the central portion 31 of the ground electrode 30c in compared with the outer surface 334c.

In some other embodiments, the inner surface 333c of the peripheral portion 33c is inclined so as to form an obtuse angle with respect to the substantially planar central portion 31 of the ground electrode 30c. The peripheral portion 33c, for example, is trapezoidal from a cross-sectional perspective view. In some embodiments, the inner surface 333c of the peripheral portion 33c forms an angle of about 120 to about 160 degrees with the substantially planar central portion 31 of the ground electrode 30c, and the outer surface 334c of the peripheral portion 33c forms an angle of about 80 to about 90 degrees with respect to a plane parallel to the substantially planar central portion 31 of the ground electrode 30c.

Figure 7:
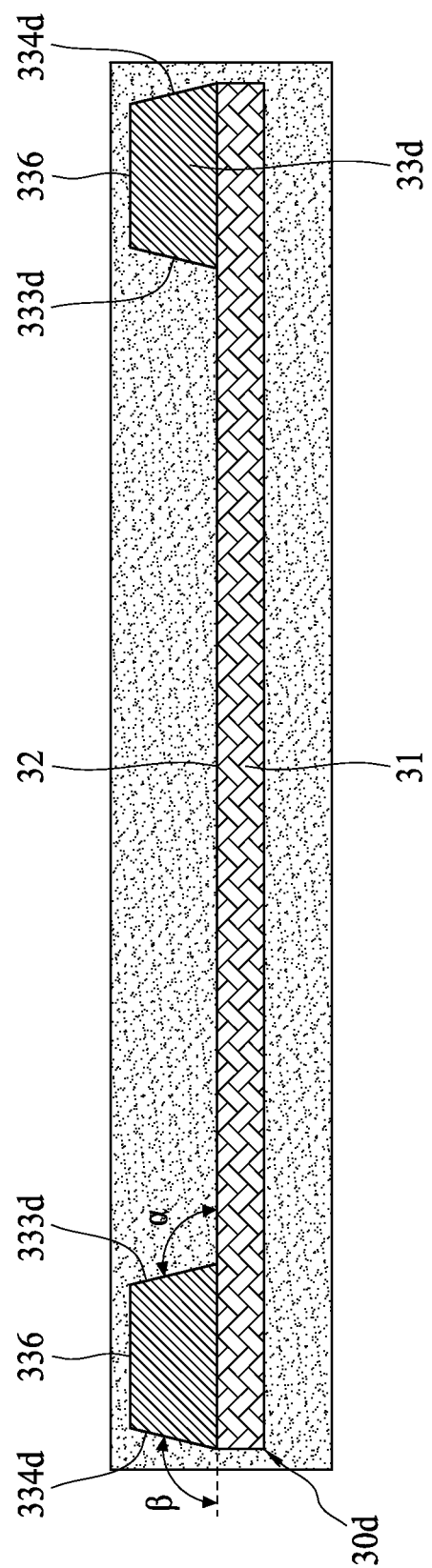
FIG. 7 is a cross-sectional view of a pedestal including a ground electrode and a peripheral portion of the ground electrode having a trapezoid shape in accordance with some embodiments of the present disclosure.

In certain embodiments, as in FIG. 7, a ground electrode 30d includes a peripheral portion 33d, which is in a trapezoid shape. The peripheral portion 33d includes an inner surface 333d, an outer surface 334d, and an upper surface 336. The inner surface 333d forms an angle α with the central portion 31 of the ground electrode 30d. The outer surface 334d forms an angle β with a plane parallel to the substantially planar central portion 31 of the ground electrode 30d. The upper surface 336 is parallel to the top surface 32 of the ground electrode 30d. In some embodiments, the angle α is from about 85 to about 120 degrees. In certain embodiments, the angle α is from about 75 to about 145 degrees. In other embodiments, the angle α is from about 65 to about 95 degrees. In some other embodiments, the angle α is from about 55 to about 105 degrees.

In some embodiments, the angle β is from about 130 to about 175 degrees. In certain embodiments, the angle β is from about 135 to about 160 degrees. In other embodiments, the angle β is from about 155 to about 165 degrees. In some other embodiments, the angle β is from about 145 to about 155 degrees. In some embodiments, the upper surface 336 is an inclined surface as well as the surface 332 as shown in FIG. 3.

Figure 8:
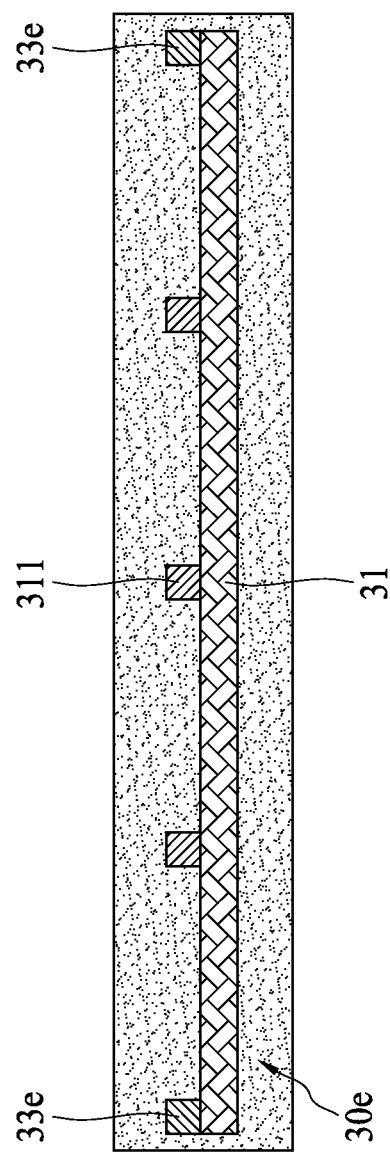
FIG. 8 is a cross-sectional view of a pedestal including a ground electrode, wherein the ground electrode further includes several protrusions located at a central portion of the ground electrode in accordance with some embodiments of the present disclosure.

In certain embodiments, as in FIG. 8, the ground electrode 30e further includes at least one protrusion 311 located at the central portion 31. The protrusion 311 has the same shape with the peripheral portion 33e or has a different shape to the peripheral portion 33e. In other words, the shape of the protrusion 311 is tailored in accordance with the predetermined plasma density distribution. Although the protrusion 311 is in a rectangular shape, the protrusion 311 is able to be modified in a trapezoid shape or other suitable shapes according to the desired application. In other embodiments, the protrusion 311 located at the central portion 31 is at a geometric center of the ground electrode 30e so as to adjust the plasma density around the geometric center.

Figure 9:
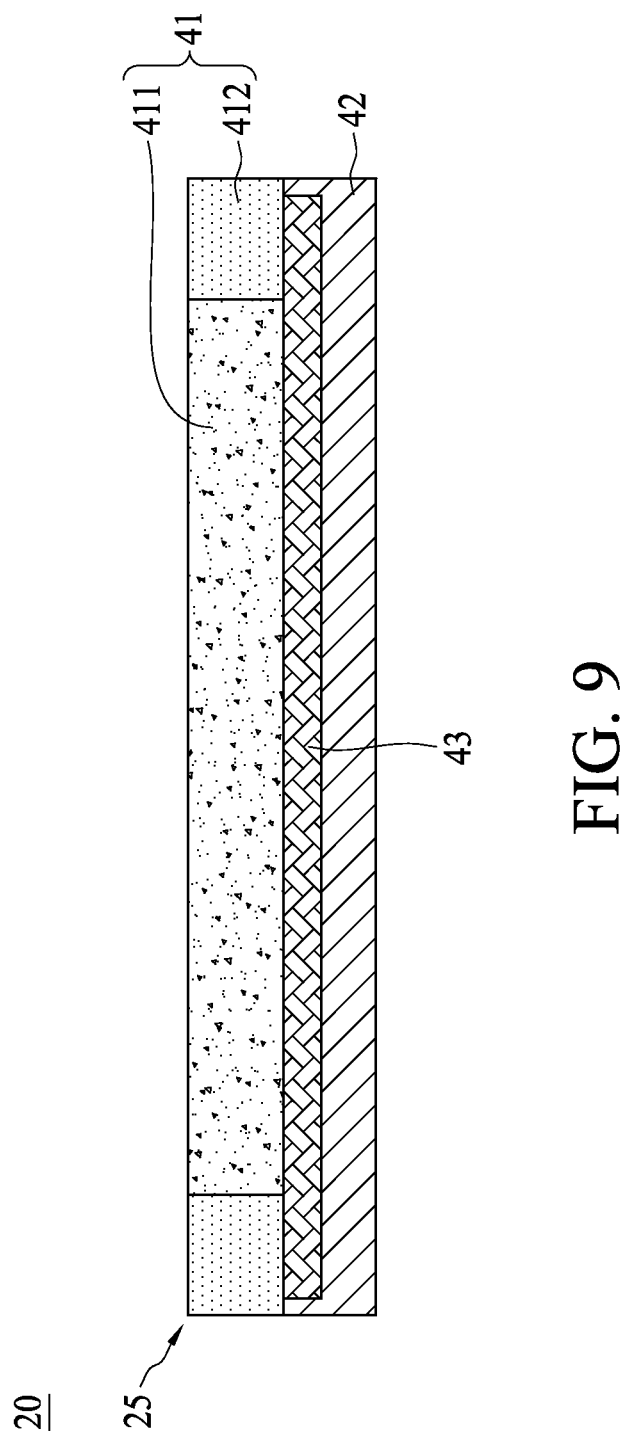
FIG. 9 is a cross-sectional view of a device including a pedestal, which includes a heater layer, wherein the heater layer includes an inner portion and an outer portion surrounding the inner portion in accordance with some embodiments of the present disclosure.

In some embodiments, as in FIG. 9, a device 20 for semiconductor fabrication includes a pedestal 25. The pedestal 25 includes a support 42, an electrode layer 43 disposed on the support 42, and a heater layer 41.

In some embodiments, the support 42 is made of silica ($SiO_2$). The support 42 has very low thermal expansion and resists high temperatures (about 1000° C. to about 1500° C.). The support 42 is also resistant against weathering. In certain embodiments, the support 42 is made of silica 72%, sodium oxide ($Na_2O$) 14.2%, magnesia (MgO) 2.5%, lime (CaO) 10.0% and alumina ($Al_2O_3$) 0.6%. In this case, the support 42 has a high thermal expansion and poor resistance to heat (about 500° C. to 600° C.). In some embodiments, the support 42 is made of silica 81%, boric oxide ($B_2O_3$) 12%, soda ($Na_2O$) 4.5%, and alumina ($Al_2O_3$) 2.0%. In this case, the support 42 has fairly low coefficients of thermal expansion (CTE is $3.25 \times 10/°$ C.), which makes the support 42 more dimensionally stable. The lower CTE also makes the support 42 less subject to stress caused by thermal expansion, and thus less vulnerable to cracking from thermal shock. In some other embodiments, the support 42 is made of silica 59%, soda ($Na_2O$) 2.0%, lead oxide (PbO) 25%, potassium oxide ($K_2O$) 12%, alumina 0.4% and zinc oxide (ZnO) 1.5%. The support 42 has a high refractive index, which provides a more brilliant appearance. In this case, the support 42 also has a high elasticity and hence, is more workable in the factory, but the support 42 cannot withstand heating very well. In other embodiments, the support 42 is made of silica 57%, alumina 16%, boric oxide ($B_2O_3$) 4.0%, barium oxide (BaO) 6.0%, magnesia 7.0% and lime 10%. In another embodiment, the support 42 is made of alumina 90% and germanium oxide ($GeO_2$) 10%.

Figure 10:
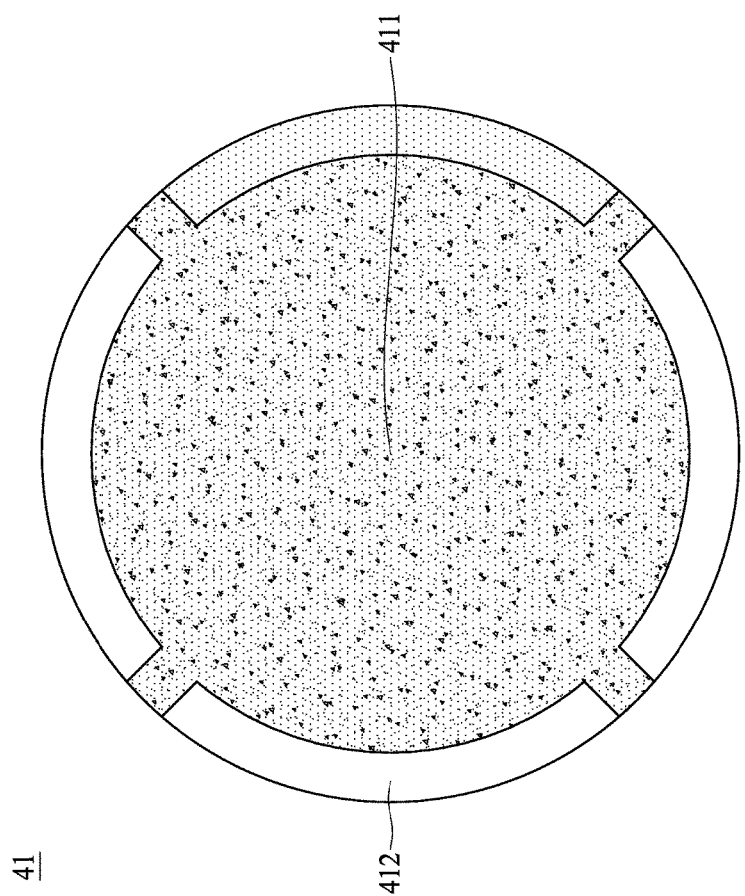
FIG. 10 is a top view of a heater layer including an outer portion and an inner portion, which is surrounded by the outer portion, wherein the outer portion is divided into several parts in accordance with some embodiments of the present disclosure.
Figure 11:
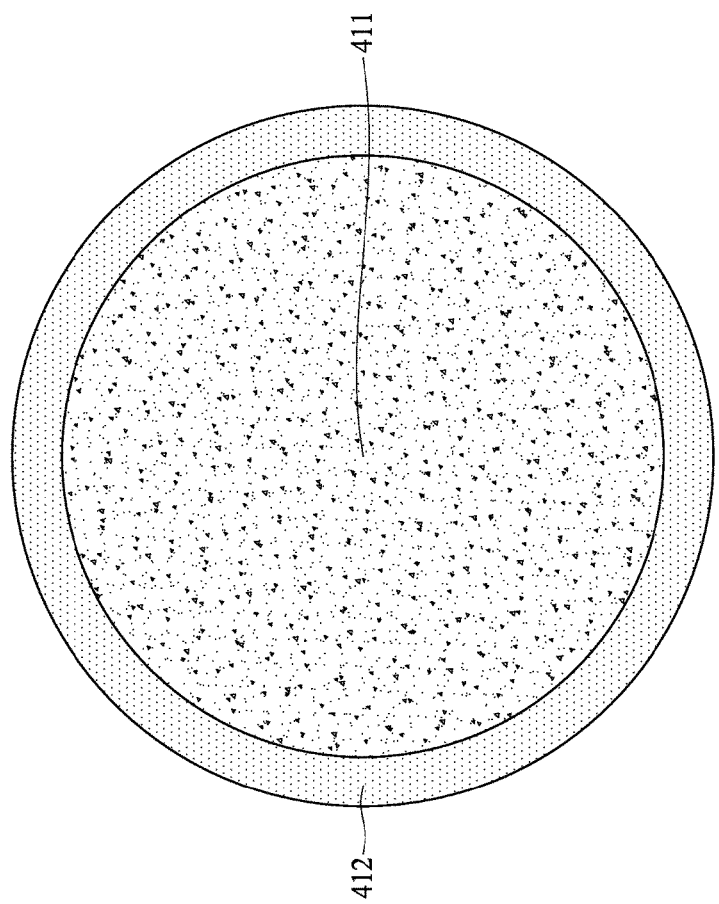
FIG. 11 is a top view of a heater layer including an inner portion and an outer portion surrounding the inner portion, wherein the outer portion is a circular structure in accordance with some embodiments of the present disclosure.

In some embodiments, the heater layer 41 is disposed on the electrode layer 43 and includes an inner portion 411 and an outer portion 412. The outer portion 412 is located at least partially around the inner portion 411. As shown in FIG. 10, the outer portion 412 discontinuously surrounds the inner portion 411. In certain embodiments, as in FIG. 11, the outer portion 412 surrounds the inner portion 411. Since a permittivity of the outer portion 412 is greater than a permittivity of the inner portion 411, an electric field around the outer portion 412 is greater than an electric field around the inner portion 411 in accordance with the following equation:

$$\varepsilon_{dielectric} \frac{V_d - 0}{d_{dielectric}} = \varepsilon_{air} \frac{V - V_d}{d_{air}}$$

The equation describes the voltage distribution between powered electrode (e.g., a showerhead) and grounded electrode (voltage is equal to 0) without the existence of plasma and charge accumulation on dielectric surface, wherein $\varepsilon_{dielectric}$ represents the permittivity of dielectric material on the top of grounded electrode; $\varepsilon_{gap}$ represents permittivity of gap space (equal to vacuum permittivity); $d_{dielectric}$ represents the thickness of dielectric material; $d_{gap}$ represents the gap distance; $V_d$ represents voltage at dielectric surface; and V represents instantaneous voltage of powered electrode.

Since the plasma intensity is increased during the increasing of the electric field, the plasma intensity above the outer portion 412 is enhanced so as to form a uniform plasma density across the entire surface of the substrate (not shown).

A coverage ratio is defined in the present disclosure as a ratio of an area occupied by the outer portion 412 to an area occupied by the inner portion 411. In some embodiments, the coverage ratio is from about 1/10 to about 1/6. In certain embodiments, the coverage ratio is from about 1/20 to about 1/5. In other embodiments, the coverage ratio is from about 1/25 to about 1/5. In some other embodiments, the coverage ratio is from about 1/40 to about 1/3. The coverage ratio is adjustable so as to obtain a desired localized plasma density at the edge of the substrate.

Figure 12:
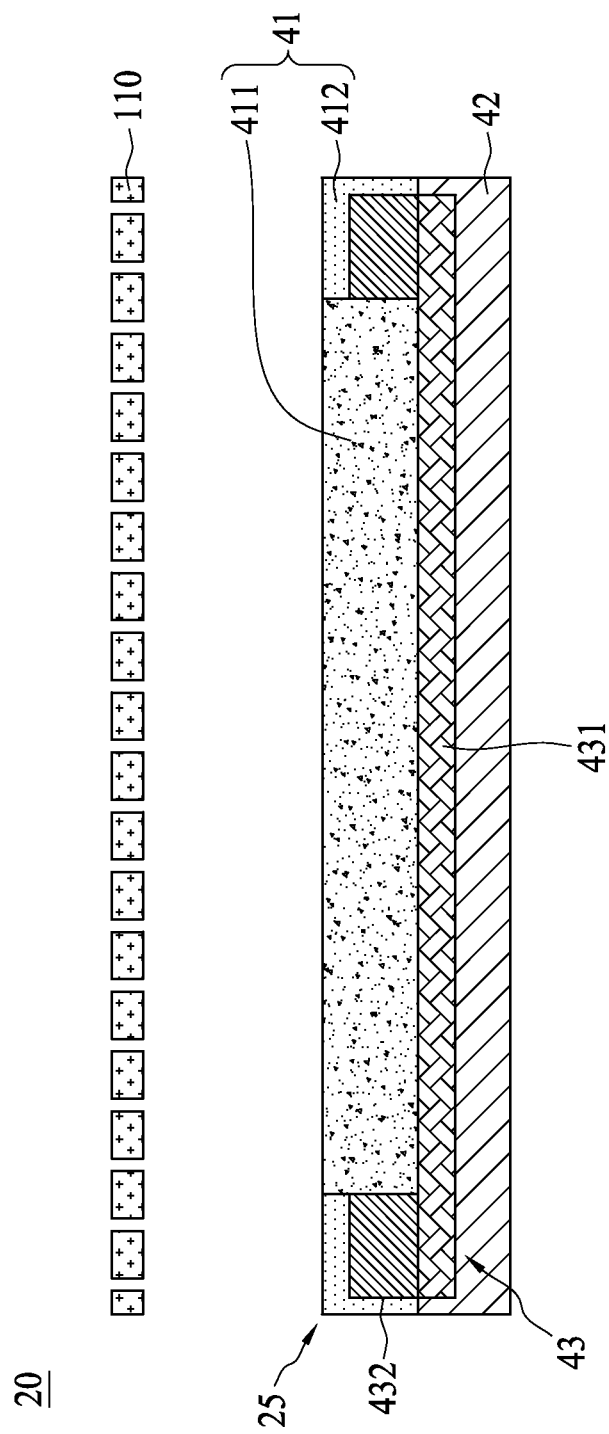
FIG. 12 is a cross-sectional view of a device including a showerhead electrode and a pedestal, which includes a heater layer and an electrode layer, wherein the heater layer includes an inner portion and an outer portion surrounding the inner portion and a protruding portion of the electrode layer has a synergistic effect with the outer portion in accordance with some embodiments of the present disclosure.

In some embodiments, as in FIG. 12, the electrode layer 43 further includes a central portion 431 and a protruding portion 432. The protruding portion 432 is located around the central portion 431 and is thicker than the central portion 431. In this case, the device 20 further includes a showerhead electrode 110, which is parallel to the electrode layer 43. The gap between the protruding portion 432 and the showerhead electrode 110 is smaller than the gap between the central portion 431 and showerhead electrode 110. Such design allows for the localized enhancement or intensification of the plasma density near the edge of a substrate (not shown) during plasma processing so as to form a synergistic effect between the smaller gap resulted from the protruding portion 432 and different permittivity between the outer portion 412 and the inner portion 411.

In some embodiments, as in FIG. 12, the top surface of the inner portion 411 is coplanar with the top surface of the outer portion 412 so as to secure the substrate (not shown). In certain embodiments, the inner portion 411 and the outer portion 412 are not necessary at the same level in accordance with various application.

Figure 13:
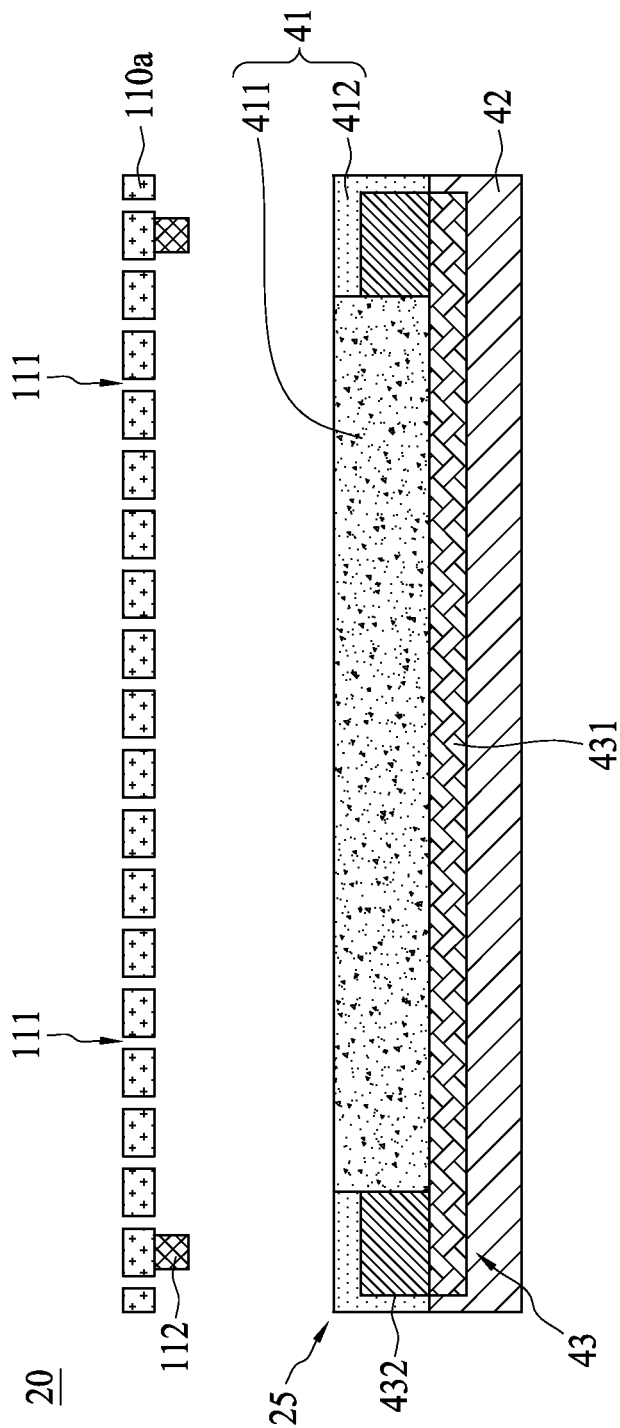
FIG. 13 is a cross-sectional view of a device further including a step on a showerhead electrode, wherein the step in combination with a heater layer and a protruding portion of an electrode layer allows for an even greater degree of control over the plasma density in accordance with some embodiments of the present disclosure.

In some embodiments, as in FIG. 13, the showerhead electrode 110a further includes a step 112 compared to the showerhead electrode 110 in FIG. 12. Several outlets 111 in the showerhead electrode 110a are used to deliver gas. The step 112 allows a reduction of the gap between the showerhead electrode 110 and the electrode layer 43. In other words, the step 112 controls a localized density of plasma formed between the showerhead electrode 110 and the electrode layer 43. In addition, the step 112 is shaped to change the plasma density by varying the localized power coupling from the electrode layer 43. Using the step 112 on the showerhead electrode 110 in combination with the material of the heater layer 41 and the protruding portion 432 allows for an even greater degree of control over the plasma density. By using different materials for the step 112, the protruding portion 432, and the heater layer 41, the degree of coupling through the plasma in the edge region is further adjusted. Various geometric features of the step 112, the protruding portion 432, and the heater layer 41 can be modified to produce a desired plasma density profile.

A method for fabricating a semiconductor structure is used during the plasma processing. The present disclosure relates to a method of treating the semiconductor substrate with plasma. The method includes a number of operations and the description and illustrations are not deemed as a limitation as to the order of the operations.

A term "deposition" is used in the present disclosure to describe an operation of locating materials on a substrate using a vapor phase of a material to be deposited, a precursor of the material, an electrochemical reaction, or sputtering/ reactive sputtering. The depositing operation includes various operations and processes and varies in accordance with the features of the embodiments. In some embodiments, depositions using a vapor phase of a material include any operations such as, but not limited to, chemical vapor deposition (CVD) and physical vapor deposition (PVD). Examples of vapor deposition methods include hot filament CVD, rf-CVD, laser CVD (LCVD), conformal diamond coating operations, metal-organic CVD (MOCVD), thermal evaporation PVD, ionized metal PVD (IMPVD), electron beam PVD (EBPVD), reactive PVD, atomic layer deposition (ALD), plasma enhanced CVD (PECVD), high density plasma CVD (HDPCVD), low pressure CVD (LPCVD), and the like. Examples of deposition using an electrochemical reaction include electroplating, electroless plating, and the like. Other examples of deposition include pulse laser deposition (PLD), and atomic layer deposition (ALD).

Figure 14:
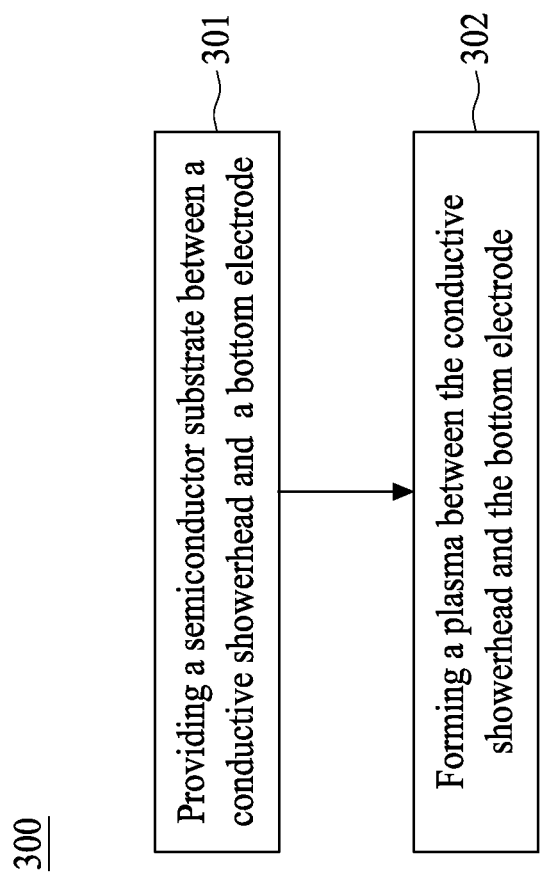
FIG. 14 is a flowchart of a method for forming a localized plasma density at an edge of a semiconductor substrate in accordance with some embodiments of the present disclosure.

FIG. 14 is a diagram of a method 300 for forming a uniform plasma density in accordance with some embodiments of the present disclosure. The method 300 includes several operations which are discussed in detail with reference to FIG. 15. At operation 301, a semiconductor substrate is provided between a conductive showerhead and a bottom electrode. The bottom electrode has a central portion and a peripheral portion. A distance between the central portion and the conductive showerhead is greater than a distance between the peripheral portion and the conductive showerhead. At operation 302, plasma is formed between the conductive showerhead and the bottom electrode.

Figure 15:
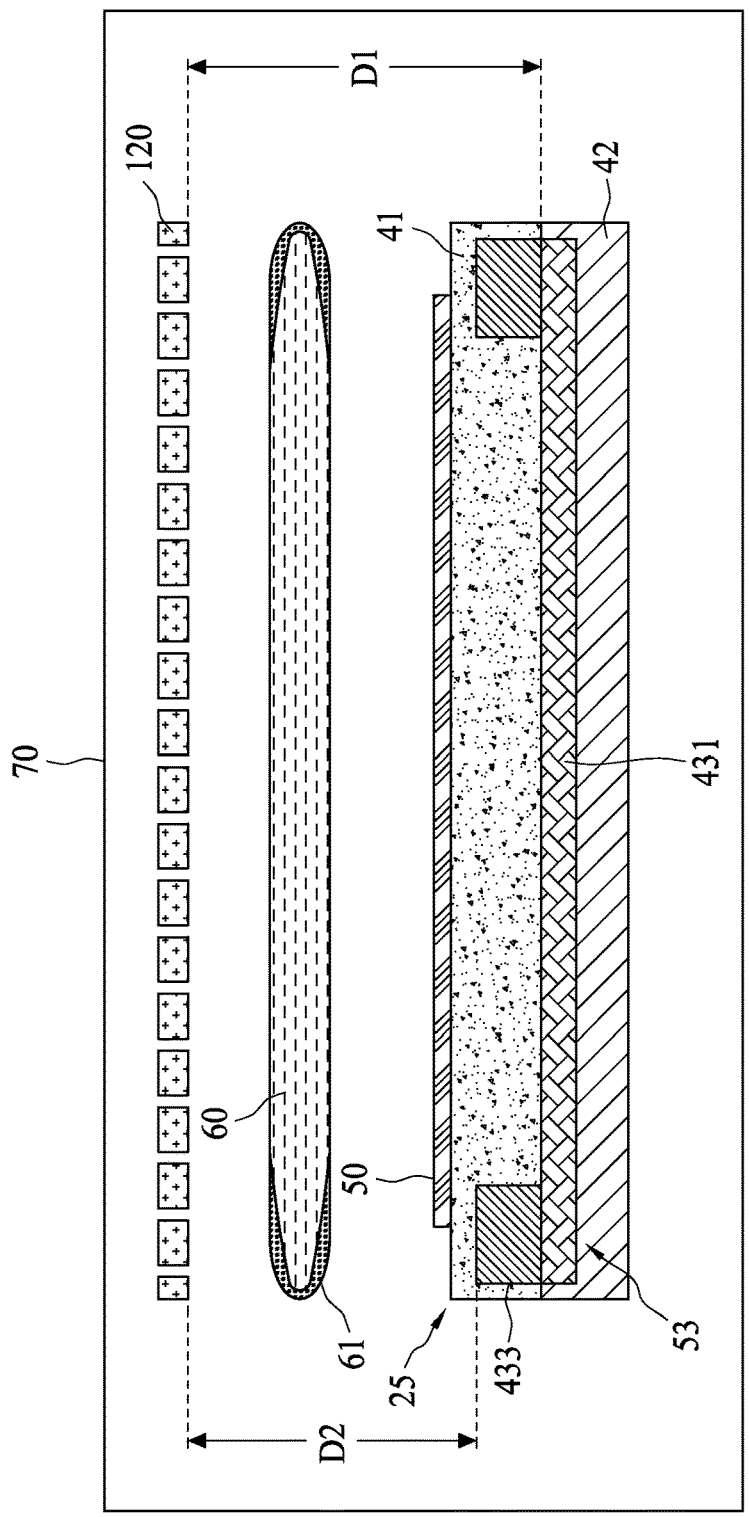
FIG. 15 is a cross-sectional view of a plasma chamber with a peripheral portion of a bottom electrode in accordance with some embodiments of the present disclosure.

FIG. 15 has been simplified for a better understanding of the concepts of the present disclosure. In FIG. 15, elements with the same labeling numbers as those in FIGS. 1 to 13 are previously discussed with reference thereto and are not repeated here for simplicity.

Although the present disclosure is described in terms of its advantages for plasma forming process, the present disclosure is also useful for other applications that requires plasma with uniform densities, such as plasma enhanced chemical vapor deposition (CVD), plasma etching, physical vapor deposition (PVD), and plasma cleaning.

Referring to FIG. 15, the semiconductor substrate 50 is provided into a plasma chamber 70 and mounted on the heater layer 41, which is disposed on the bottom electrode 53. A conductive showerhead 120 is located above the semiconductor substrate 50. In other words, the semiconductor substrate 50 is disposed between the conductive showerhead 120 and the bottom electrode 53. The bottom electrode 53 includes a central portion 431 and a peripheral portion 433, which projects from a top surface of the central portion 431 and extends at least partially around the central portion 431. The size of central portion 431 is substantially smaller or equal to the semiconductor substrate 50. Because the peripheral portion 433 is projecting from the top surface of the central portion 431, the distance D2 between the bottom surface of the conductive showerhead 120 and the top surface of the peripheral portion 433 is smaller than the distance D1 between the top surface of the central portion 431 and the bottom surface of the conductive showerhead 120. The process gas is discharged into the plasma chamber 70 and through the conductive showerhead 120 to form plasma 60 between the conductive showerhead 120 and the bottom electrode 53.

In some embodiments, the bottom electrode 53 is coupled to the ground and the conductive showerhead 120 is coupled to a bias voltage. In certain embodiments, both the bottom electrode 53 and the conductive showerhead 120 is respectively coupled with a bias voltage, or the bottom electrode 53 is coupled to a bias voltage and the conductive showerhead 120 is grounded. In other embodiments, the plasma 60 is carried out under the following conditions: 1500 Watts RF power at 27 MHz; 1100 Watts RF power at 2 MHz; 52 mTorr chamber pressure above the wafer; 135 sccm argon gas; 15 sccm $C_4F_8$ gas; 10 sccm $O_2$ gas; −10° C. temperature of bottom electrode 53; and 60 second process time.

In some embodiments, as in FIG. 15, the bottom electrode 53 and the conductive showerhead 120 are facing each other and spaced apart from one another with a gap. The gap is not uniform and is smaller at the peripheral portion 433 than at the central portion 431, therefore the electric field between the peripheral portion 433 and the conductive showerhead 120 is greater than the electric field between the central portion 431 and the conductive showerhead 120. The intensified electric field around the peripheral portion 433 also enhances of the plasma density 61 near the edge of the semiconductor substrate 50. Thus, the plasma uniformity is improved.

In some embodiments, the method further includes adjusting a coverage ratio of the peripheral portion 433 to change distribution of plasma 60 generated between the conductive showerhead 120 and the bottom electrode 53. In some embodiments, the coverage ratio is from about 1/11 to about 1/4. In certain embodiments, the coverage ratio is from about 1/21 to about 1/2. In other embodiments, the coverage ratio is from about 1/27 to about 1/7. In some other embodiments, the coverage ratio is from about 1/43 to about 1/8. The coverage ratio is able to change the plasma density so as to obtain a desired localized plasma density at the edge of the substrate. Additionally, the peripheral portion 433 is set to beyond or outside of the edge of the semiconductor substrate 50 in order to focus the plasma 60 on the edge of the semiconductor substrate 50.

Figure 16:
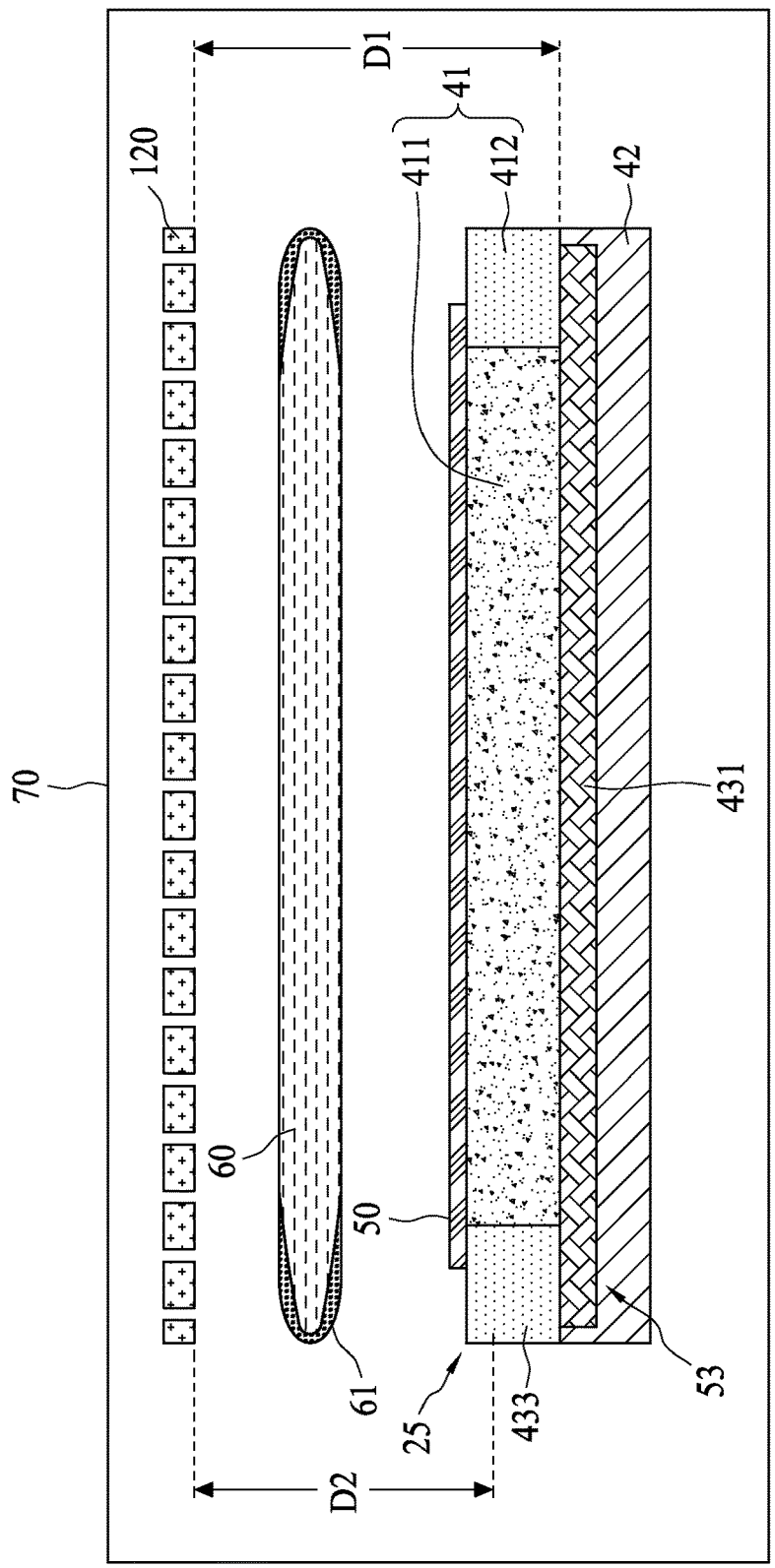
FIG. 16 is a cross-sectional view of a plasma chamber with a heater layer including an inner portion and an outer portion surrounding the inner portion for uniform plasma density in accordance with some embodiments of the present disclosure.

In some embodiments, as in FIG. 16, the heater layer 41 includes inner portion 411 and outer portion 412. The capacitance impedance for the inner portion 411 and outer portion 412 may be different. For example, the inner portion 411 has higher capacitive impedance and the outer portion 412 has lower capacitive impedance, which allows plasma formed above the outer portion 412 possesses a higher density than the plasma density above the inner portion 411. The outer portion 412 with lower capacitive impedance compensates the decreased plasma density at the edge so as to enhance the localized plasma density 61 above the edge of the semiconductor substrate 50.

In some embodiments, a device includes a pedestal. The pedestal includes a ground electrode. The ground electrode includes a top surface, a central portion, and a peripheral portion. The peripheral portion is projected from the top surface, thereby having a height difference between the central portion and the peripheral portion.

In some embodiments, the peripheral portion is thicker than the central portion along a direction substantially perpendicular to the top surface. The central portion of the ground electrode is substantially planar.

In some embodiments, a device includes a pedestal. The pedestal includes a support, an electrode layer, and a heater layer. The electrode layer is disposed on the support. The heater layer is disposed on the electrode layer. The heater layer includes an inner portion and an outer portion. The outer portion is located at least partially around the inner portion. A permittivity of the outer portion is greater than a permittivity of the inner portion.

In some embodiments, a method includes forming uniform plasma. The method also includes providing a semiconductor substrate between a conductive showerhead and a bottom electrode. The bottom electrode has a central portion and a peripheral portion. A distance between the central portion and the conductive showerhead is greater than a distance between the peripheral portion and the conductive showerhead. The method also includes forming a plasma between the conductive showerhead and the bottom electrode.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing the claims.

Various operations of embodiments are provided herein. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment provided herein. It will be appreciated that layers, features, elements, etc. depicted herein are illustrated with particular dimensions relative to one another, such as structural dimensions or orientations, for example, for purposes of simplicity and ease of understanding and that actual dimensions of the same differ substantially from that illustrated herein, in some embodiments.

Further, unless specified otherwise, "first," "second," or the like are not intended to imply a temporal aspect, a spatial aspect, an ordering, etc. Rather, such terms are merely used as identifiers, names, etc. for features, elements, items, etc. For example, a first channel and a second channel generally correspond to channel A and channel B or two different or two identical channels or the same channel.

As used in this application, "or" is intended to mean an inclusive "or" rather than an exclusive "or." In addition, "a" and "an" as used in this application are generally to be construed to mean "one or more" unless specified otherwise or clear from context to be directed to a singular form. Furthermore, to the extent that "includes", "having", "has", "with", or variants thereof are used in either the detailed description or the claims, such terms are intended to be inclusive in a manner similar to "comprising."

What is claimed is:

1. A device, comprising:
   a pedestal comprising:
      a ground electrode comprising:
         a top surface;
         a central portion; and
         a peripheral portion, wherein the peripheral portion is projected from the top surface thereby having a height difference between the central portion and the peripheral portion, and the peripheral portion is at an edge of the ground electrode; and
      an insulator layer on the ground electrode, wherein the insulator layer is in direct contact with an edge and an upper surface of the peripheral portion of the ground electrode,
      wherein the ground electrode and the insulator layer are made from different materials.

2. The device of claim 1, wherein the peripheral portion is thicker than the central portion along a direction substantially perpendicular to the top surface, and the central portion of the ground electrode is substantially planar.

3. The device of claim 1, wherein the ground electrode is embedded in the insulator layer.

4. The device of claim 3, wherein the peripheral portion is located partially around the central portion.

5. The device of claim 1, wherein the upper surface of the peripheral portion is substantially parallel to the top surface.

6. The device of claim 1, wherein the ground electrode further includes a protrusion located at the central portion.

7. The device of claim 6, wherein the protrusion located at the central portion is at a geometric center of the ground electrode.

8. The device of claim 1, wherein the peripheral portion is an integral part of the one-piece monolithic ground electrode.

9. The device of claim 1, wherein the peripheral portion is a separate piece and bonded to the ground electrode.

10. A device, comprising:
    a pedestal comprising:
       a ground electrode embedded in an insulator layer, the ground electrode comprising:
          a central portion having a top surface; and
          a peripheral portion having an upper surface, wherein the upper surface of the peripheral portion and the top surface of the central portion are at different levels, the peripheral portion of the ground electrode is thicker than the central portion of the ground electrode, the peripheral portion is at an edge of the ground electrode, and wherein the peripheral portion includes an outer edge distal to the central portion, and the upper surface of the peripheral portion is covered by the insulator layer, and the outer edge of the peripheral portion is surrounded by the insulator layer.

11. The device of claim 10, wherein a height difference between the upper surface of the peripheral portion and the top surface of the central portion ranges from about 0.1 mm to about 8.7 mm.

12. The device of claim 10, wherein the peripheral portion is made from the same material as the central portion.

13. The device of claim 10, wherein the peripheral portion is made from a different material from the central portion.

14. The device of claim 10, wherein the ground electrode further includes a protrusion located at the central portion.

15. The device of claim 14, wherein the protrusion has the same shape with the peripheral portion.

16. The device of claim 14, wherein the protrusion has a different shape from the peripheral portion.

17. A device, comprising:
    a pedestal comprising:
       a ground electrode embedded in an insulator layer, the ground electrode comprising:
          a central portion having a top surface and a perimeter outline; and
          a peripheral portion over the top surface and proximal to the perimeter outline of the central portion, wherein the peripheral portion includes a plurality of divided sections, and the plurality of divided sections are disconnected from one another.

18. The device of claim 17, wherein the insulator layer surrounds the ground electrode.

19. The device of claim 17, wherein the peripheral portion is configured to adjust plasma density at an edge of a substrate.

20. The device of claim 1, wherein the pedestal further comprises a supporter under the ground electrode, and a material of the supporter comprises silica, sodium oxide, magnesia, lime, alumina, boric oxide, soda, lead oxide, potassium oxide, zinc oxide, barium oxide, germanium oxide or a combination thereof.

\* \* \* \* \*